United States Patent [19]

Kumbasar et al.

[11] Patent Number: 5,266,890
[45] Date of Patent: Nov. 30, 1993

[54] TEST WAFER FOR DIAGNOSING FLAWS IN AN INTEGRATED CIRCUIT FABRICATION PROCESS THAT CAUSE A-C DEFECTS

[75] Inventors: Cevat Kumbasar, Carlsbad; Jonathan A. Levi, Fallbrook, both of Calif.; Richard J. Petschauer, Edina, Minn.; Roy R. Shanks; Steven S. Wei, both of San Diego, Calif.

[73] Assignee: Unisys Corporation, Blue Bell, Pa.

[21] Appl. No.: 905,596

[22] Filed: Jun. 26, 1992

[51] Int. Cl.$^5$ .......................................... G01R 31/00
[52] U.S. Cl. ............................... 324/158 R; 324/73.1; 371/22.5
[58] Field of Search ........... 324/158 R, 158 T, 158 F, 324/73.1; 371/21.2, 22.3, 22.6; 437/8; 257/48; 368/113

[56] References Cited

U.S. PATENT DOCUMENTS

| | | | |
|---|---|---|---|
| 4,243,937 | 1/1981 | Maltani et al. | 324/158 T |
| 4,486,705 | 12/1984 | Stopper | 324/73.1 |
| 4,855,253 | 8/1989 | Weber | 324/158 R |
| 4,956,602 | 9/1990 | Parrish | 324/158 R |
| 5,053,700 | 10/1991 | Parrish | 324/158 R |
| 5,059,899 | 10/1991 | Farnworth et al. | 324/73.1 |
| 5,095,267 | 3/1992 | Merrill et al. | 324/158 D |

*Primary Examiner*—Vinh Nguyen
*Attorney, Agent, or Firm*—Charles J. Fassbender; Mark T. Starr

[57] ABSTRACT

An integrated circuit test wafer quickly detects A-C defects in any process by which the wafer is fabricated. This test wafer includes a semiconductor substrate having a major surface, and a diagnostic circuit that is repeatedly integrated over most of the wafer's surface. Each diagnostic circuit includes: a) a plurality of ring oscillators which generate respective cyclic output signals; b) an addressing circuit that receives external input signals and in response selects an output signal from any particular ring oscillator of the plurality; c) a timing circuit that generates a timing signal with a certain time period; and, d) a counting circuit that counts the number of cycles that occur in the selected output signal during the time period and provides that number as an output. By comparing the relative or absolute speeds of all of the ring oscillators, a ring oscillator with an A-C defect is detected; and, a defective ring oscillator can then be analyzed under an E-beam microscope to determine the defects cause. Preferably, the ring oscillators occupy at least 90% of the test wafers surface so that A-C defects are detected even when they are sparsely distributed on the test wafer.

10 Claims, 5 Drawing Sheets

TEST WAFER FOR DIAGNOSING FLAWS IN AN INTEGRATED CIRCUIT FABRICATION PROCESS THAT CAUSE A-C DEFECTS

BACKGROUND OF THE INVENTION

This invention relates to tools for analyzing integrated circuit fabrication processes; and more particularly, it relates to tools for detecting the presence of any flaw in a process which causes A-C defects.

Basically, an integrated circuit is comprised of a semiconductor substrate on which about a dozen layers of different materials, that have intricate microscopic patterns, are disposed on top of one another in a stack. To build this stack, many complex fabrication steps need to be sequentially performed. As one example of the details of those steps and a representative integrated circuit fabrication process, see pages 428–431 of the textbook "Silicon Processing For The VLSI Era" Volume 2 by Stanley Wolf, Lattice Press of Sunset Beach, Calif., Copyright 1990.

If the integrated circuit fabrication steps could be performed in an ideal fashion, each layer in the stack would have uniform physical characteristics at all points across the substrate. However, absolute uniformity is impossible to achieve. Consequently, the circuits which are made from the stack of layers vary in their physical structure; and some of those variances cause differences in the speed of which the circuits operate.

In a normal integrated circuit fabrication process, the respective speeds of the circuits that are produced fall within some predefined allowable range. This allowable range can be defined for example as $T_{AVE} \pm 4.5\ \sigma$ where $T_{AVE}$ is an average delay and where $\sigma$ is one standard deviation. Any circuit which has a signal propagation delay that is too slow to be acceptable is herein defined to have an A-C defect.

Typically, the layers in an integrated circuit form hundreds of thousands of transistors which are interconnected along ten's of thousands of signal paths. This, in fact, occurs in any digital application specific integrated circuit (ASIC). For such circuits, to test every signal path for an A-C defect is impossible.

One practical reason for not testing every signal path is that such testing is too time consuming and thus too expensive, due to the large number of paths. Also, a conventional integrated circuit tester simply sends a set of input signals to a circuit under test and then after a fixed time interval measures the response of the circuit. Thus, a circuit which responds too slowly but with the correct output signals within the fixed time interval will pass the test.

This then presents a real dilemma because if a circuit with an A-C defect is incorporated into an electronic unit that is sold to a customer, the signal path with the A-C defect could cause an error when that signal path is activated. However, if the signal path with the A-C defect is only activated once in a while and at random time instants, then the source of the error is very difficult to identify and correct.

BRIEF SUMMARY OF THE INVENTION

Accordingly the present invention provides an integrated circuit test wafer which quickly detects A-C defects in any process by which the wafer is fabricated. This test wafer comprises a semiconductor substrate having a major surface, and a diagnostic circuit that is repeatedly integrated over most of the wafer's surface.

Each diagnostic circuit includes: a) a plurality of ring oscillators which generate respective cyclic output signals; b) an addressing circuit that receives external input signals and in response selects an output signal from any particular ring oscillator of the plurality; c) a timing circuit that generates a timing signal with a certain time period; and, d) a counting circuit that counts the number of cycles that occur in the selected output signal during the time period and provides that number as an output.

To determine if any particular integrated circuit fabrication process has a flaw which causes A-C defects, the above described test wafer is fabricated by that process. Then, each diagnostic circuit on the wafer is activated by an integrated circuit tester to determine the respective counts that are generated in the timing period by all of the ring oscillators. These counts give the relative speeds of the ring oscillators, and the absolute speeds of the ring oscillators are given by the length of the timing period times the ratio of the actual counts to a reference count. By comparing these relative or absolute speeds of all of the ring oscillators, a ring oscillator with an A-C defect is detected. A defective ring oscillator can then be analyzed under an E-beam microscope to determine the defects cause. Preferably, the ring oscillators occupy at least 90% of the test wafers surface so that A-C defects are detected even when they are sparsely distributed on the test wafer.

DETAILED DESCRIPTION OF THE INVENTION

Figure 1:
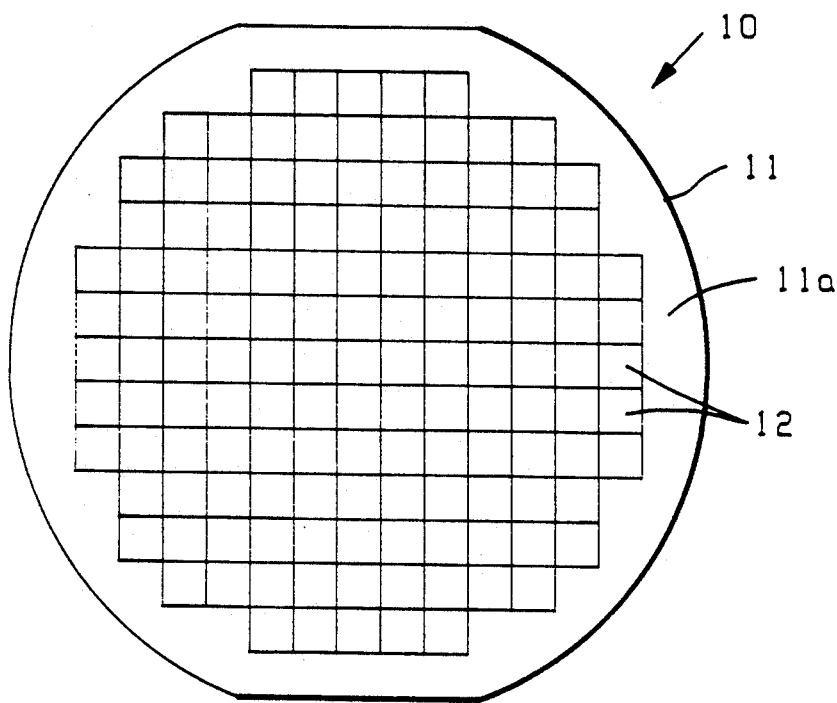
FIG. 1 shows an overview of a test wafer which is structured as one preferred embodiment of the present invention.

Referring now to FIG. 1, it shows an overview of an integrated circuit test wafer 10 which is structured as one preferred embodiment of the invention. This test wafer 10 consists of a semiconductor substrate 11 having a surface 11a on which a certain diagnostic circuit 12 is integrated multiple times. Circuit 12 has a physical layout as shown in FIG. 2, and a logic diagram of circuit 12 is shown in FIG. 3.

Figure 2:
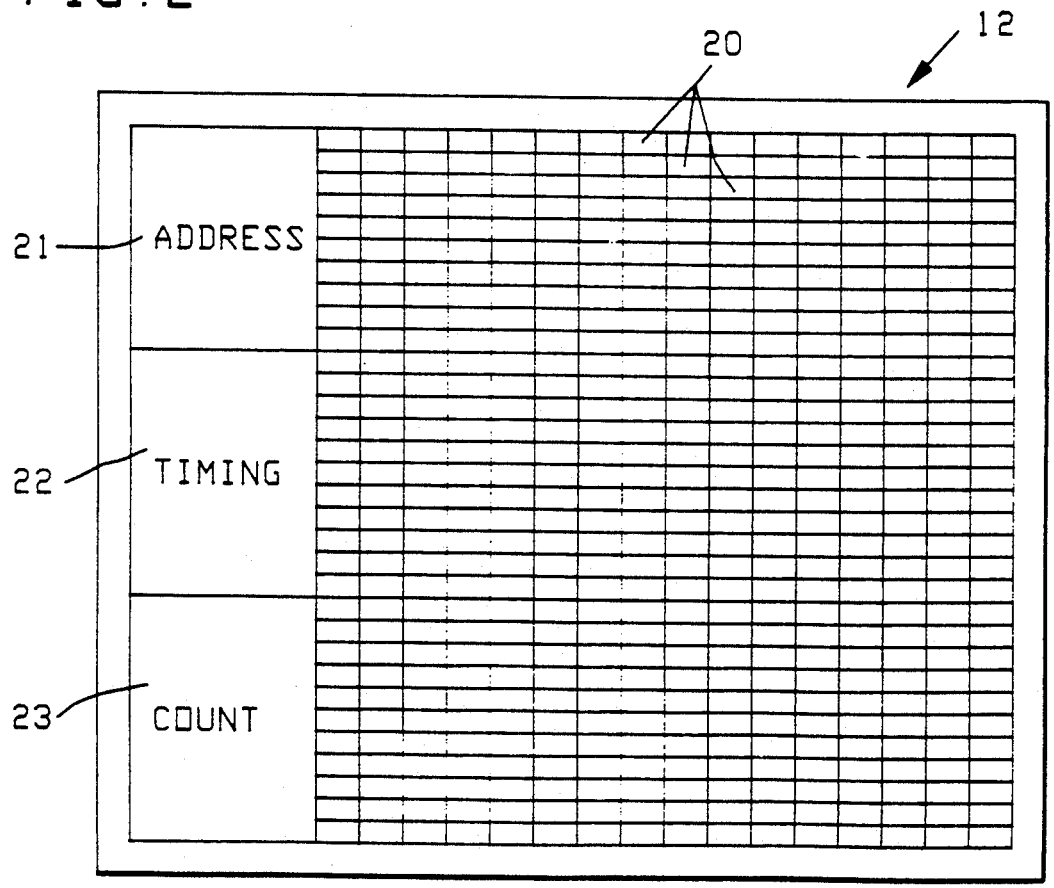
FIG. 2 shows a physical layout of a diagnostic circuit that is repeatedly integrated as an array on the FIG. 1 wafer.
Figure 3:
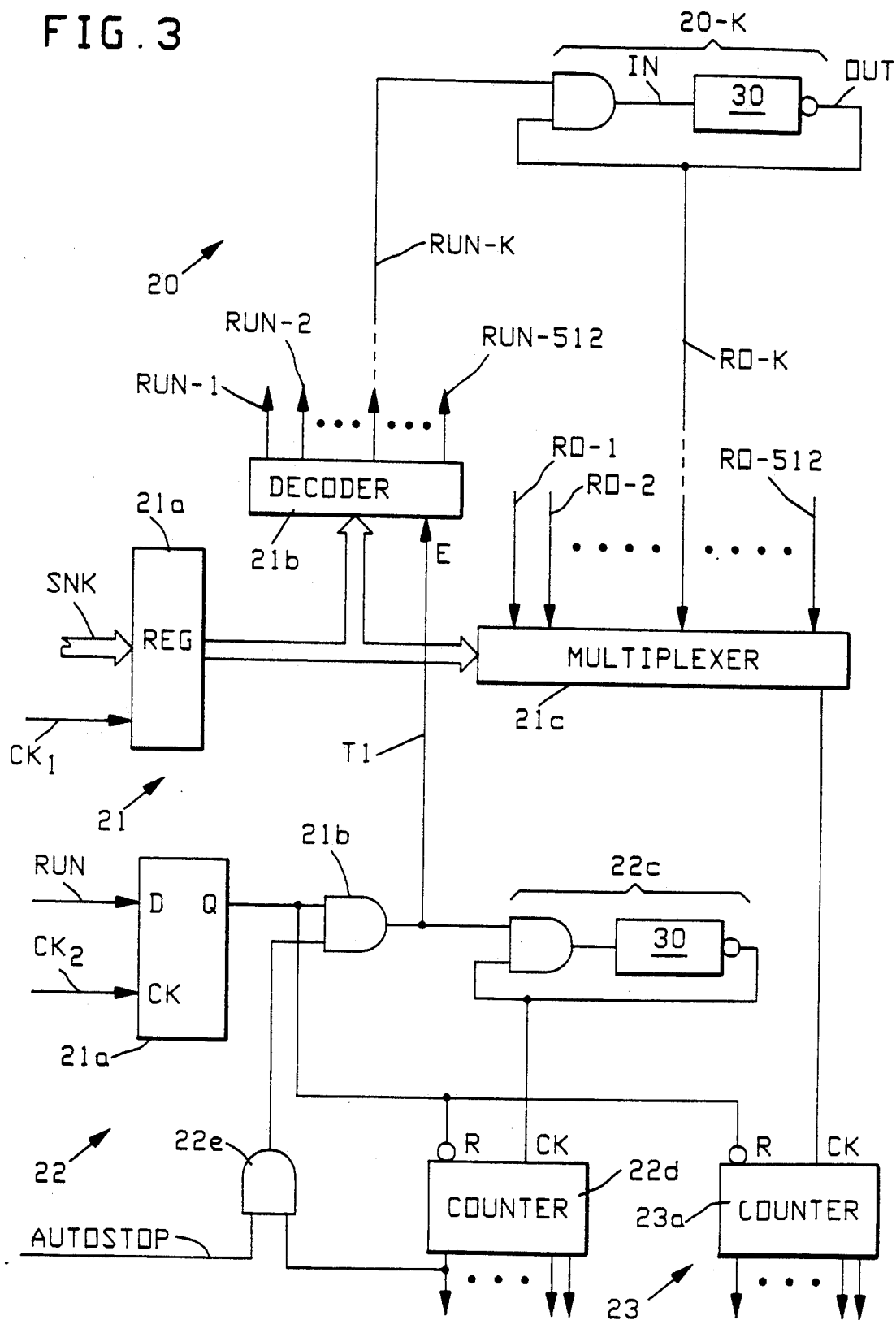
FIG. 3 is a logic diagram of the diagnostic circuit of FIG. 2.

As can be seen from the FIGS. 2 and 3, the diagnostic circuit 12 includes a large array of ring oscillators 20. These oscillators total five-hundred-twelve in number, and they occupy over 90% of the FIG. 2 physical layout area. Also included as the remainder of the diagnostic circuit 12 is an address circuit 21, a timing circuit 22, and a counting circuit 23.

FIG. 3 shows that the address circuit 21 consists of a register 21a, a decoder 21b, and a multiplexer 21c. Also, FIG. 3 shows that the timing circuit 22 consists of a D-type flip-flop 22a, an AND gate 22b, a reference ring oscillator 22c, a ten-bit counter 22d, and a NAND gate 22e. Lastly, the counting circuit consists of a ten-bit counter 23a. All of these components are interconnected as shown.

In operation, the address circuit 21 receives input signals $SN_K$ that represent a binary number $N_K$. Those signals are loaded into the register 21a by a clock signal $CK_1$ whereupon the number $N_K$ is decoded by the decoder 21b. Then, when the decoder's enable input "E" is enabled, the decoder 21b sends a RUN-K signal to the K-th ring oscillator 20-K which allows it to oscillate. At the same time, the number $N_K$ is decoded by the multiplexer 21c which in response transfers the output signal RO-K of K-th ring oscillator to the counter 23a.

In the timing circuit 22, an external input signal AUTOSTOP is held in a "1" state while flip-flop 22a is alternately set and rest by an external RUN signal and a clock signal $CK_2$. When flip-flop 22a is reset, both of the counters 22d and 23a get reset to a binary count of zero. Also, the reset state of flip-flop 22a causes the output of AND gate 22b to be a "0"; and, that in turn inhibits the decoder 21b which stops all of the ring oscillators 20 and 22c from oscillating.

Conversely, when flip-flop 22a is set, both of the counters 22d and 23a are able to count. Also, the set state of flip-flop 22a, together with a "0" on the most significant output bit from counter 23a, causes a timing signal T1 from the output of AND gate 22b to be a "1". In response to the T1 signal, the decoder 21b is enabled and the addressed ring oscillator 20-K together with the reference ring oscillator 22c start to oscillate.

Each oscillation of the addressed ring oscillator 20-K is counted by the counter 23a, and each oscillation of the reference ring oscillator is counted by the counter 22d. That counting continues until the most significant bit from counter 22d switches from a "0" to a "1". When that occurs and the AUTOSTOP signal is a "1", the output of NAND gate 22a becomes a "0". Then the timing signal T1 from AND gate 22b becomes a "0"; and in response, the ring oscillators 20 and 22c are inhibited from oscillating.

Figure 4:
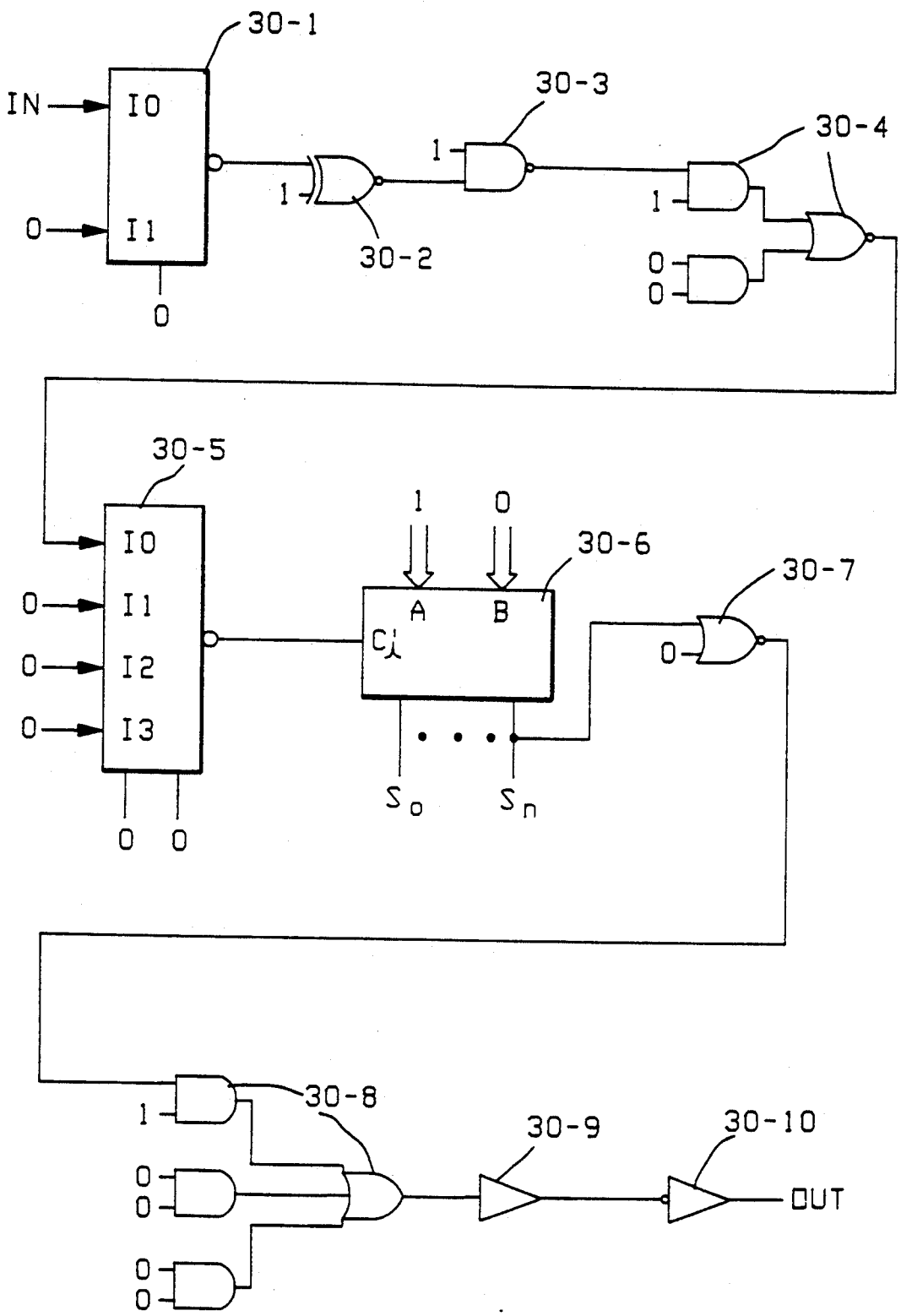
FIG. 4 shows the details of a ring oscillator which occurs multiple times in the diagnostic circuit of FIG. 3.

All of the ring oscillators 20 and 22c have the same internal circuit structure which consists of a serial string of logic gates 30. One suitable string of gates is shown in FIG. 4 wherein item 30-1 is a two input multiplexer; item 30-2 is an Exclusive-NOR gate; item 30-3 is a NAND gate; item 30-4 is a double AND-OR gate; item 30-5 is a four input multiplexer; item 30-6 is an adder; item 30-7 is a NOR gate; item 30-8 is a triple AND-OR gate; item 30-9 is a noninverting buffer; and item 30-10 is an INVERTER. Also, the lengths of the interconnections between the gates in each string 30 are all the same. Thus, the time that it takes for a signal to propagate through any one string of gates 30 should ideally be the same for each string.

However, due to the inherent complexity of any integrated circuit fabrication process, many microscopic physical variations will occur in the gate strings 30 from one location to another across the wafer 10; and, those physical variations will alter the signal propagation time through gate strings.

Now if the above described wafer 10 has any physical variation which has the effect of slowing down the propagation delay through any one of the logic gate strings 30 to an unacceptable level, that gate string will have an A-C defect. And, with the wafer 10, these A-C defects are detected quickly and accurately as follows.

To begin, all of the external input signals to one of the diagnostic circuits 20 are supplied by an integrated circuit tester, and all of the output signals of the counters 22d and 23a are monitored by the tester. One suitable tester, for example, is a Sentry 50 from Schlumberger Corporation. For each ring oscillator in the array 20, the tester holds the AUTOSTOP signal at a "1" and sequentially performs the following steps: a) reset flip-flop 22a; b) load a number $N_K$ into register 21 to select the K-th ring oscillator the array 20; c) set flip-flop 22a; d) wait for the counter 22d to stop counting; and e) read the count from counter 23a. After the steps a)-e) have been performed for each ring oscillator in the array 20, the tester then: f) holds the AUTOSTOP signal at "0" which enables the reference ring oscillator 22c to run continuously, and g) samples the output of counter 22d for a certain time period in order to determine the cycle time of the reference ring oscillator. Thereafter, all of the above steps a-g are repeated once for each of the diagnostic circuits 12 on the wafer 10.

Figure 5A:
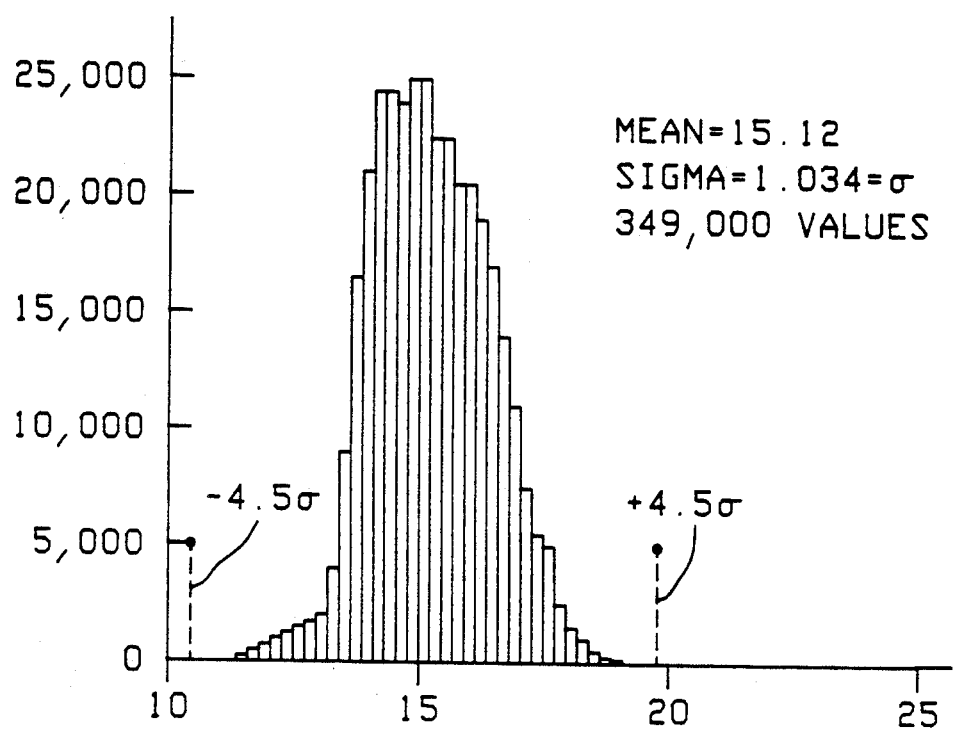
FIGS. 5A–5B show the cycle time for the ring oscillator of FIGS. 4 and 5 that occurred in several actual test wafers that were fabricated; and, FIG. 6 is a logic diagram of a circuit that is an alternative to a portion of the FIG. 3 circuit.
Figure 5B:
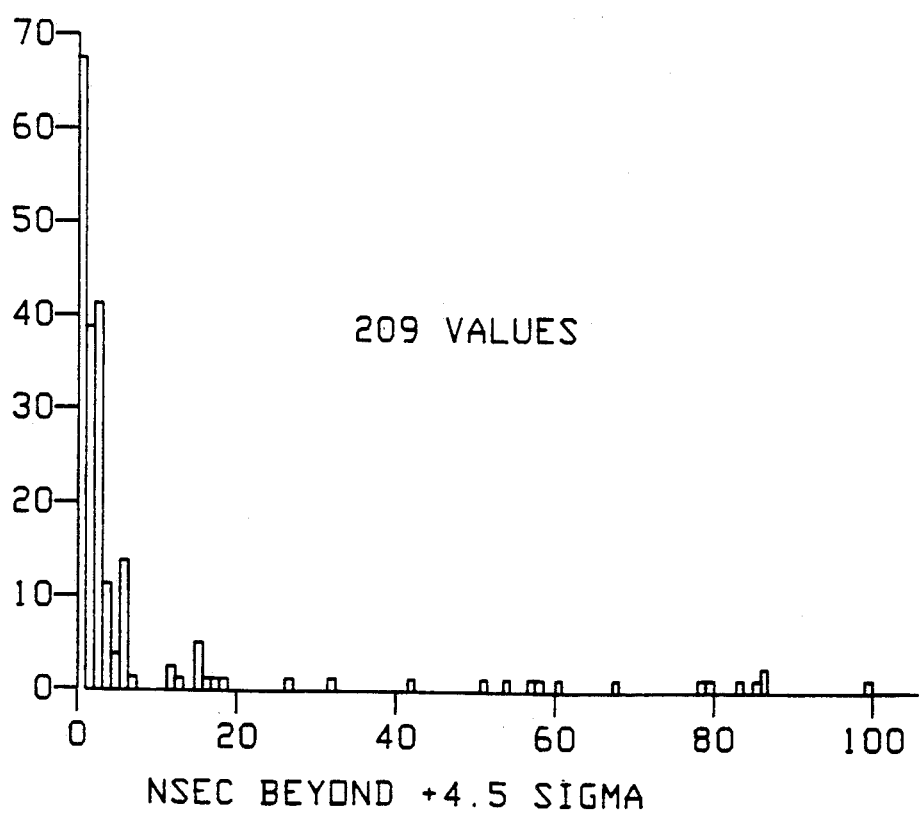

To obtain the cycle time of a particular ring oscillator in the array 20 from the above test data, the cycle time of the reference ring oscillator 22c is simply multiplied by the ratio of the number in counter 22d to the number in counter 23a. This ratio becomes more accurate when the number in counter 22d which stops the timing signal T1 increases; and preferably, that number is at least one-hundred. Then, the cycle times of all of the ring oscillators 20 can be plotted as shown in FIGS. 5A and 5B to illustrate the occurrence of any A-C defects on the wafer 10. In those FIGS. 5A and 5B, cycle time is shown on the horizontal axis and the number of ring oscillators that have a particular cycle time is shown on the vertical axis.

From inspection of FIG. 5A alone it appears that the cycle times of all of the ring oscillators 20 fall within ±4.5 sigma of the average cycle time. This would be an acceptable distribution of the cycle times, and thus one might conclude that no A-C defects occurred on the wafer 10. However, when the scale of the vertical axis is expanded, as is done in FIG. 5B, the occurrence of several A-C defects can be seen. These A-C defects, if they are not detected, will also occur in any other circuits which are made by the same process that fabricated the wafer 10; and if those circuits are shipped to customers, they can cause serious problems.

An important feature of the above described wafer 10 is that it detects the A-C defects even when they are very small in number and are located randomly anywhere on the wafer 10. This feature is achieved because the ring oscillators 20 occupy almost all of the surface area 11a on the wafer 10. With a lower concentration of the ring oscillators 20 across the wafer 10, the physical variation which causes an A-C defect could occur where no ring oscillator exists and thus remain undetected. FIGS. 5A and 5B, for example, are made from tester data on several actual wafers in which the ring oscillators occupied over 90% of the wafer's surface area. These wafers together contained 349,000 of the ring oscillator strings of FIG. 4; and, only 209 of those ring oscillators had cycle times which differed from the average by more than 4.5σ. In other words, the A-C defects occurred in less than 0.06% of the wafer area; and, trying to find such an infrequent defect without using the disclosed wafer 10 is extremely difficult. It's like looking for a needle in a haystack.

Another important feature of the wafer 10 is that it enables A-C defects to be detected very quickly. In the above described test procedure a-g, all of the steps (except steps d and g) take only about a microsecond to perform. Step d lasts for the cycle time of the reference ring oscillator 22c times the count $C_{MAX}$ in counter 22d which forces the timing signal T1 to a "0". Assuming, for example, a cycle time of 15 ns and a count $C_{MAX}$ of 1024, step d takes (15 ns)×(1024) or 15.36 microseconds. Step g lasts until enough samples of the counter 22d are taken to enable the cycle time of reference ring oscillator to be determined accurately. This requires a periodic sampling for at least two seconds so that many cycle times from a "1" sample to a "0" sample and back to a "1" sample can be averaged and thereby obtain an accurate measurement.

On the wafer 10 in FIG. 1, the diagnostic circuit 12 is repeated one-hundred-thirty-seven times; and on diagnostic circuit 12 of FIG. 2, the array 20 contains five-hundred-twelve ring oscillators. Thus, to perform all of the steps a-g on the entire wafer 10 takes (15.36 microseconds)×(512)+(2 sec)×137, or less than four minutes. By comparison, suppose that the diagnostic circuit 12 contained only the array of ring oscillators 20 and the addressing circuit 21, (i.e.—suppose that the timing circuit 22 and counting circuit 23 were eliminated). In that case, the period of each ring oscillator 20 would have to be determined by direct sampling of the output of multiplexer 21c, and thus the total time to do that sampling would be (2 seconds per ring oscillator)×(512 ring oscillators per diagnostic circuit)×(136 diagnostic circuits per wafer), or 38.68 hours!

Still another feature of the test wafer 10 is that it readily provides a large volume of timing data; and, such a large volume of data is required in order to build a statistical data base from which the speed of other chips that are made by the same process can be predicted. For example, if the timing distribution of FIG. 5A has a narrow spread, that indicates that other chips which are made by the same fabrication process will run at close to the same speed; and vice versa. Having a narrow speed distribution is highly desirable; and being able to predict the speed distribution of chips that are made from a certain fabrication process is extremely useful because the selling price of a chip can be made proportional to the chip's speed.

As one modification to the above described diagnostic circuit of FIGS. 3 and 4, the make up of the string of logic gates 30 in the ring oscillators 20 can be changed. For example, the total number of logic gates can be increased or decreased from that shown in FIG. 4; different types of logic gates can be incorporated into the string; and the interconnections between gates can be made to any predetermined length. Also, all of the ring oscillators within the array 20 need not be the same. For example, the ring oscillators in the array 20 can be made of four different logic gate strings as follows: string #1 is gates 30-1 thru 30-5 of FIG. 4 with ten micrometers of interconnection between each gate; string #2 is two of the FIG. 4 connected in series with ten micrometers of interconnection between each gate; and strings #3 and #4 respectively are the same as strings #1 and #2 but with five-hundred micrometers of interconnection between each gate.

As another modification, the total number of ring oscillators in array 20 can change from the five-hundred-twelve shown in FIG. 2. For example, the number of ring oscillators in array 20 can be cut in half, and the total number of arrays 20 can be doubled; or vice versa. Also, the counters 22f and 23a are not limited to being ten-bits long; those counters can have any number of bits. Likewise, the count $C_{MAX}$ which stops the timing period T1 can be any count. Preferably however, $C_{MAX}$ is at least one-hundred so that the cycle time of the ring oscillators is accurate within 1% of the reference ring oscillator cycle time. Further, the time delay of a ring oscillator which is not acceptable and thus constitutes an A-C defect is not limited to a delay which exceeds $T_{AVE}+4.5\sigma$. Other suitable standards are of the form $T_{AVE}+k\sigma$, where k is in the range of 2 to 6.

Figure 6:
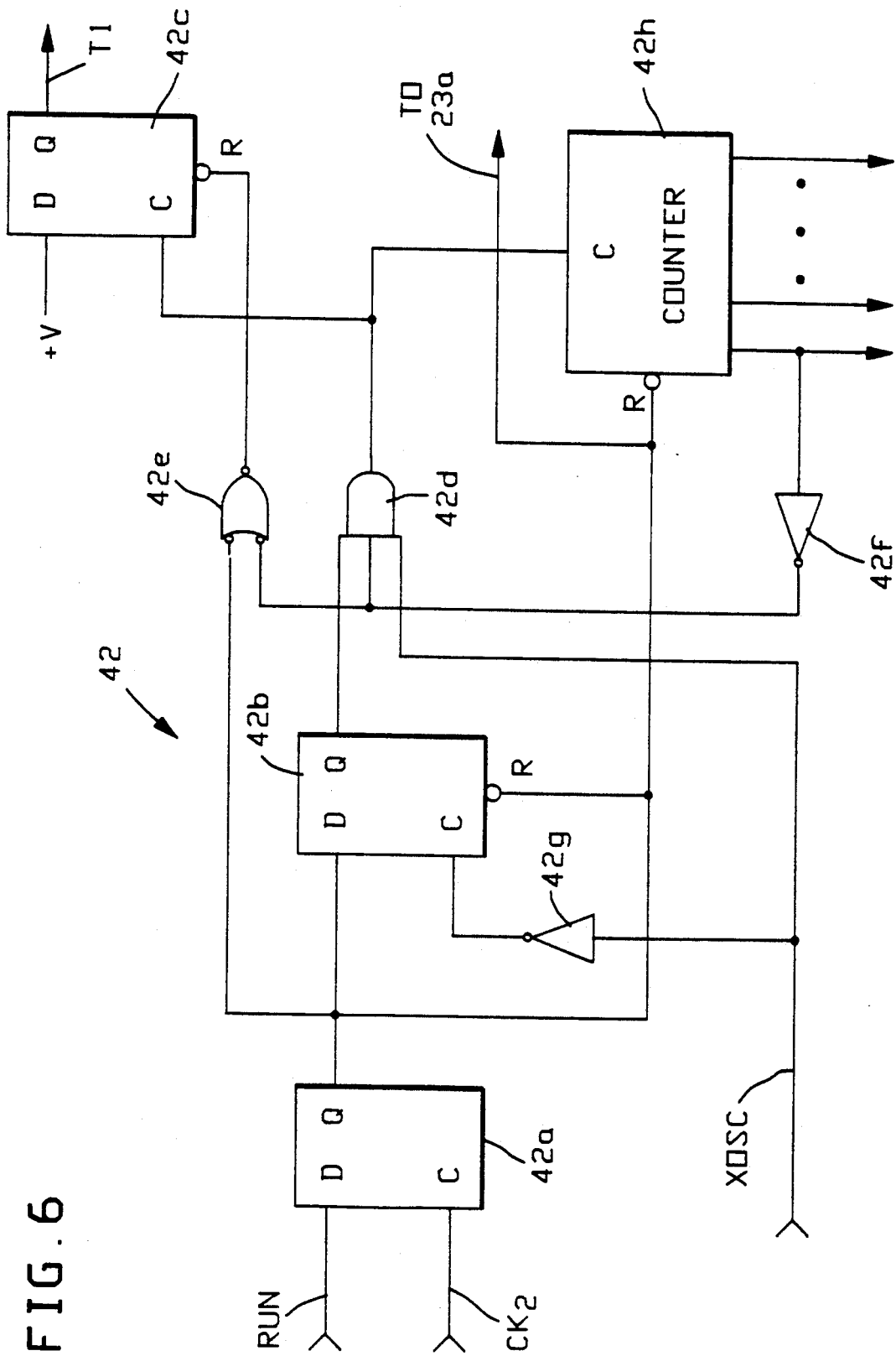

As still another modification, the timing circuit 22 of FIG. 3 can be replaced with the timing circuit 42 of FIG. 6. By this modification, an external oscillator signal X0SC is utilized to generate the timing signal T1 which enables each addressed ring oscillator R0-K to oscillate. If the external oscillator signal X0SC has a highly accurate period $T_0$, then the oscillation period of the addressed ring oscillator can be quickly and accurately determined as $T_0$ times the ratio of the counts that are read from the counters 23d and 23a; and, steps f-g of the previously described tester procedure are eliminated.

Included within the timing circuit 42 are three D-type flip-flops 42a–42c, an AND gate 42d, an OR gate 42e, a pair of INVERTERS 42f and 42g, and a counter 42h. All of those components 42a–42h are interconnected as shown. In operation, flip-flop 42a is initially reset in response to the external RUN signal and the clock signal $CK_2$ which come from the tester module. When flip-flop 42a is reset, the other two flip-flops 42b and 42c get reset; and also, both of the counters 42h and 23a (of FIG. 3) get reset. Then, after a number $N_K$ is loaded into the address register 21a (of FIG. 3), flip-flop 42a gets set by the external signals RUN and $CK_2$.

With flip-flop 42a set, flip-flop 42b gets set in synchronization with the falling edge of the external oscillators signal X0SC. Then, with flip-flop 42b set, the X0SC signal will pass through AND gate 42d. Each rising edge of the oscillating signal from AND gate 42d is counted by the counter 42b. Also, the first rising edge of the oscillating signal from AND gate 42d sets flip-flop 42c which makes the timing signal T1 a "1". That in turn, enables the address decoder 21b (of FIG. 3), which enables the addressed ring oscillator R0-K (of FIG. 3), which causes the counter 23a (of FIG. 3) to count. Subsequently, when the most significant bit of counter 42h becomes a "1", the output of inventor 42f becomes a "0"; and in response, flip-flop 42c gets reset. That makes the timing signal T1 a "0" which prevents the selected ring oscillator RO-K from oscillating. Also, the "0" output of inverter 42f inhibits the XOSC signal from passing through AND gate 42d which stops the counter 42b from counting.

Several preferred embodiments of the invention have now been described in detail. In addition, however, many changes and modifications can be made to the details of those embodiments without departing from the nature and spirit of the invention. Accordingly, it is to be understood that the invention is not limited to the preferred embodiments but is defined in the appended claims.

What is claimed is:

1. An integrated circuit test wafer, which detects flaws in any process by which the wafer is fabricated, comprising:

a semiconductor substrate having a major surface;
multiple copies of a diagnostic circuit that are integrated over most of said surface; each copy of said diagnostic circuit including-
   a plurality of ring oscillators which generate respective cyclic output signals;
   an addressing circuit, coupled to said ring osciallators, that receives external input signals and in response selects an output signal from any particular ring oscillator of said plurality;
   a timing circuit that generates a timing signal with a certain time period; and,
   a counting circuit, coupled to said timing circuit and said addressing circuit, that counts the number of cycles that occur in the selected output signal during said time period and provides that number as an output.

2. A test wafer according to claim 1 wherein said timing circuit includes a reference ring oscillator which generates a cyclic reference signal and a reference counter which generates said timing signal by counting a predetermined number of cycles in said reference signal.

3. A test wafer according to claim 2 wherein said reference counter counts at least one-hundred cycles of said reference signal to generate said timing signal.

4. A test wafer according to claim 1 wherein said timing circuit includes a logic gate which receives a cyclic reference signal from an external source, and a reference counter which generates said timing signal by counting a predetermined number of cycles in said reference signal.

5. A test wafer according to claim 4 wherein said reference counter counts at least one-hundred cycles of said reference signal to generate said timing signal.

6. A test wafer according to claim 1 wherein said diagnostic circuit is repeated on at least 90% of the major surface of said substrate.

7. A test wafer according to claim 1 wherein said plurality of ring oscillators are repeated on at least 90% of the major surface of said substrate.

8. A test wafer according to claim 1 wherein each ring oscillator of said plurality includes a serial chain of at least five logic modules that each perform a different logic function.

9. A test wafer according to claim 1 wherein each ring oscillator of said plurality includes a serial string of logic modules; and, the number of modules in each string are not the same.

10. A test wafer according to claim 1 wherein each ring oscillator of said plurality includes a serial string of logic modules; and, the serial interconnections between the modules of each string are not the same length.

* * * * *